United States Patent [19]

Merrill et al.

[11] Patent Number: 5,824,717
[45] Date of Patent: *Oct. 20, 1998

[54] PEROXIDE AND RADIATION CURABLE COMPOSITIONS CONTAINING ISOBUTYLENENE COPOLYMERS HAVING ACRYLATE FUNCTIONALITY

[75] Inventors: Natalie Ann Merrill, Deer Park; Hsien-Chang Wang, Bellaire; Anthony Jay Dias, Houston, all of Tex.

[73] Assignee: Exxon Chemical Patents Inc., Wilmington, Del.

[*] Notice: The term of this patent shall not extend beyond the expiration date of Pat. No. 5,162,445.

[21] Appl. No.: 476,754

[22] Filed: Jun. 7, 1995

Related U.S. Application Data

[63] Continuation-in-part of Ser. No. 211,899, Oct. 19, 1992, Pat. No. 5,459,174, which is a continuation-in-part of Ser. No. 779,177, Oct. 17, 1991, abandoned, which is a continuation-in-part of Ser. No. 441,575, Nov. 22, 1989, abandoned, Ser. No. 442,028, Nov. 27, 1989, Pat. No. 5,162,445, Ser. No. 631,610, Dec. 20, 1990, abandoned, and Ser. No. 633,645, Dec. 20, 1990, abandoned, each is a continuation-in-part of Ser. No.199,665, May 27, 1988, abandoned, Ser. No. 416,503, Oct. 3, 1989, abandoned, and Ser. No. 416,713, Oct. 3, 1989, abandoned.

[51] Int. Cl.⁶ .................................................. C08F 8/20
[52] U.S. Cl. ......................... 522/81; 522/35; 522/149; 522/904; 522/333.4
[58] Field of Search ............................ 522/81, 35, 904, 522/149; 525/333.4

[56] References Cited

U.S. PATENT DOCUMENTS

| | | | |
|---|---|---|---|
| 3,560,465 | 2/1971 | Reynolds | 260/91.3 |
| 3,694,383 | 9/1972 | Azami et al. | 260/2 XA |
| 3,867,270 | 2/1975 | Malatesta et al. | 204/159.18 |
| 3,867,318 | 2/1975 | Nishikubo et al. | 260/2 A |
| 3,923,703 | 12/1975 | Fukutani et al. | 260/2 A |
| 4,086,373 | 4/1978 | Tobias et al. | 427/44 |
| 4,188,215 | 2/1980 | Sato et al. | 430/156 |
| 4,315,998 | 2/1982 | Neckers et al. | 525/332 |
| 4,335,225 | 6/1982 | Collette et al. | 525/240 |
| 5,162,445 | 11/1992 | Powers et al. | 525/333.4 |
| 5,376,503 | 12/1994 | Audett et al. | 522/35 |
| 5,459,174 | 10/1995 | Merrill et al. | 522/35 |

FOREIGN PATENT DOCUMENTS

| | | | |
|---|---|---|---|
| 0017364 | 10/1980 | European Pat. Off. | C08F 218/12 |
| 1 341 004 | 12/1973 | United Kingdom | C08F 27/12 |

*Primary Examiner*—Mark Chapman
*Attorney, Agent, or Firm*—Myron B. Kurtzman; Cathrine L. Bell

[57] ABSTRACT

The invention relates to peroxide- or radiation-curable copolymer containing compositions and to the resulting radiation- or peroxide- cured compositions. The compositions may optionally contain a reinforcing filler. Copolymers employed in the compositions are acrylate modified copolymers of an isoolefin of 4 to 7 carbon atoms and para-alkylstyrene comonomers. Since the percentage of extractables from the cured composition is negligible, the cured compositions are suitable for use in the manufacture of a variety of high purity rubber goods used in the pharmaceutical and health care industries. In addition, the compositions may be employed as condenser packings and as food contact materials or wire cable insulation materials. Further, the cured composition may be employed in the manufacture of high purity hoses.

5 Claims, No Drawings

PEROXIDE AND RADIATION CURABLE COMPOSITIONS CONTAINING ISOBUTYLENENE COPOLYMERS HAVING ACRYLATE FUNCTIONALITY

CROSS-REFERENCE TO RELATED APPLICATIONS

This application is a continuation-in-part of Ser. No. 08/211,899 filed Oct. 19, 1992 now U.S. Pat. No. 5,459,174 which is a continuation-in-part of Ser. No. 779,177, Oct. 17, 1991, abandoned, which is a continuation-in-part of Ser. No. 441,575, Nov. 22, 1989, abandoned, Ser. No. 442,028, Nov. 27, 1989, U.S. Pat No. 5,162,445, Ser. No. 631,610, Dec. 20, 1990, abandoned, and Ser. No. 633,645, Dec. 20, 1990, abandoned, said Ser. No. 441,575, Ser. No. 442,028, Ser. No. 631,610, and Ser. No. 633,645, each, is a continuation-in-part of Ser. No. 199,665, May 27, 1988, abandoned, Ser. No. 416,503, Oct. 3, 1989, abandoned, and Ser. No. 416,713, Oct. 3, 1989, abandoned.

FIELD OF THE INVENTION

This invention relates to peroxide or radiation curable compositions containing functionalized copolymers of isoolefin and para-alkylstyrene and to the resulting cured compositions containing such copolymers. Further, the invention relates to high purity shaped articles of manufacture containing the cured compositions. Such articles include those for use in biomedical industries and medical devices; hoses, such as automotive hoses; wire cable insulation materials; condenser packing; and articles such as packaging and films for food contact.

BACKGROUND OF THE INVENTION

There is an increasing demand for articles for use in the biomedical arts which have a high standard of purity. When used in conjunction with the human body, such articles must meet sanitation and stability standards. In fact, most industrialized countries require that medical devices designed for contact with body fluids or medicaments meet specified standards prior to distribution into the marketplace.

Polyvinyl chloride has commonly been used in the manufacture of devices for biomedical use due to its superior workability, flexibility, transparency, heat resistance and the like. The high flexibility characteristics of plasticized PVC is attributed to the presence of plasticizers in the vulcanized composition. For instance, blood storage bags composed of PVC typically contain from 30 to 60 parts by weight of a phthalate plasticizer. In addition, the prior art compositions for biomedical devices typically contain curatives and other migratory additives. In addition, as a result of extraction of materials, such as plasticizers, the flexibility of the shaped article can be diminished.

The search to solve the problem of surface migration of additives found in PVC applications has led to the discovery of high molecular weight elastomeric polypropylenes. For instance, U.S. Pat. No. 4,335,225 discloses the preparation of such polymers by polymerizing the monomers in the presence of a catalyst which is an organic derivative of zirconium with hydroxylated alumina. However, the aluminum content in the resultant polymer has proven to be unacceptable for biomedical uses.

Butyl polymers also have found application in many molded and fabricated goods, such as elastomeric stoppers for medication containers, by virtue of their excellent resistance to heat and chemical agents, low permeability to gases and vapors, high damping properties and good sealing properties. Butyl rubber, however, is not particularly suited for radiation or peroxide curing.

Peroxide cure systems have the advantages of fast curing reactions, excellent heat resistance and absence of inorganic impurities which are inherent in alternative curing systems.

The need exists therefore for new polymeric materials suitable for the manufacture of articles for biomedical applications which have the requisite mechanical and optical properties needed for the industry from which the extractability of materials from the composition is eliminated.

Such high purity polymers have applications in other emerging fields, such as condenser packings. Condenser packings are rubber seals or stoppers employed in electronic capacitors or condensers which contain the liquid electrolyte. Presently lactones, specifically gamma-butyrolactone, are being preferentially used as electrolyte over the once-conventional dimethyl formamide. The rubber of condenser packings must not only exhibit high electrical and chemical resistance, they must also exhibit thermal stability in light of the increased operating temperatures employed in the industry today. To meet such increased demands, the industry has looked towards those elastomers which are peroxide cured. Butyl polymers have been widely used for such applications because they exhibit the requisite sealing and electrical and chemical resistance properties. In addition, they are relatively impermeable to air. However, butyl polymer containing compositions lack the necessary requisite heat resistance. While halogenated butyl polymers provide greater heat resistance, such polymers may lead to metal corrosion.

Highly pure rubber materials are further needed in the automotive industry for use as hoses, such as radiator coolant hoses, to transport fluids. Typically, compositions used in the manufacture of such hoses contain curatives and rubber compounding additives as well as non-reinforcing and reinforcing fillers. As the hoses age, such materials undesirably migrate into the fluid.

Further still, highly pure materials are needed as wire cable insulation and shield materials. Typically, compositions forming such sheaths are exposed to extreme electrical conditions, great temperature fluctuations and changing atmospheric conditions. New materials are presently needed for forming effective insulating and shielding materials for the wire and cable articles.

Still further, highly pure rubbers are needed in the food industry, especially where the polymer composition comes into contact with food. Such food contacting articles must exhibit high puncture resistance, gloss, and reduced permeability to gases and/or vapors. Films for food contact desirably exhibit low flexural modulus, good tear strength, high elastic recovery and reduced draw resonance.

It would be highly desirable to find a radiation or peroxide curable butyl-like elastomer composition which is essentially free of extractable additives and curative substances and which has saturated polymeric backbones which are non-degradable. Elastomers cured by such methods could be utilized in biomedical applications, condenser packing, wire cable insulation and shielding materials, hosings, food contact applications and other areas in which a highly pure curative- or additive-free composition is desired or wherein the toxicity or additives or curatives present manufacturing difficulties and hazards.

Radiation-cured polymeric compositions are well known in the art. For example, European Patent Application 0 017 364 discloses copolymers curable by actinic radiation, such as UV light, made by incorporating from 0.1 to 10 percent by weight of the copolymer of an allyl benzoylbenzoate comonomer with a polymerizable monoethylenically unsaturated comonomer. These polymers are useful in coating and impregnating formulations, and in adhesive, caulk and sealant formulations. U.S. Pat. No. 4,315,998 to Neckers et al. discloses polymeric materials which incorporate photosensitive functionality via a nucleophilic substitution reaction. The polymeric materials serve as a platform for heterogeneous catalysts for a variety of photoinitiated chemical reactions. U.S. Pat. No. 4,188,215 to Sato et al.; U.S. Pat. No. 3,923,703 to Fukutani et al.; U.S. Pat. No. 3,867,318 to Nishikubo et al.; U.S. Pat. No. 3,694,383 to Azami et al.; and U.S. Pat. No. 3,560,465 to Reynolds; and U.K. Patent 1,341,004 all relate to polymeric resins incorporating photosensitive functionality and/or processes for making such resins. These photosensitive resins are generally useful in photographic films. Photosensitive coatings comprising a blend of a polymer and a photosensitive crosslinking agent are disclosed in U.S. Pat. No. 3,867,270 to Malatesta, et al. In this patent, a conjugated diene containing butyl rubber is cured by ultraviolet radiation with the aid of certain photosensitizers. A similar composition said to be useful as a coating for glass substrates is disclosed in U.S. Pat. No. 4,086,373 to Tobias et al., as comprising at least a rubbery thermoplastic organic polymer and an organic photosensitizer.

Previous work has been documented of nucleophilic substitution reactions to isobutylene/para-methylstyrene/para-bromomethylstyrene terpolymers to produce pendant acrylate/photosensitizer functionalized, soluble copolymers. In commonly assigned U.S. Ser. No. 441,575, filed Nov. 22, 1989, which is also a continuation-in-part of co-pending U.S. Ser. No. 416,503 filed Oct. 3, 1989, which is a continuation-in-part of co-pending U.S. Ser. No. 199,665 filed May 27, 1988; and co-pending U.S. Ser. No. 416,713 filed Oct. 3, 1989, which is a continuation-in-part of U.S. Ser. No. 199,665 filed May 27, 1988, the disclosures of which are hereby incorporated by reference, it was theorized that the introduction of controlled amounts of specific functionality as pendant groups on the saturated hydrocarbon backbone would greatly extend usefulness by permitting these polymers to be adhered to other surfaces and/or to be co-reacted with or compatibilized with other functional polymers by "grafting" or crosslinking reactions. It was further theorized that the introduction of pendant functionality of the right type and amounts would permit these saturated hydrocarbon polymers to be "painted" or coated with or on other materials, and/or to be laminated with or dispersed in other materials to yield composite materials with a desired combination of properties.

Commonly assigned U.S. Pat. No. 5,162,445 and U.S. Ser. Nos. 631,610 and 633,645, both filed Dec. 20, 1990, all of which are incorporated herein by reference, disclose radiation reactive functionalized copolymers comprising an iso-olefin having about 4 to about 7 carbon atoms and a para-alkylstyrene, wherein a radiation-reactive functional group is attached to the para-alkyl group of the para-alkylstyrene.

SUMMARY OF THE INVENTION

The present invention relates to peroxide- or radiation-curable copolymer containing compositions which are heat and chemical resistant, exhibit superior workability, low permeability to gases and vapors, high damping properties, and good sealing properties and which are essentially free of extractable materials such as curatives and non-reactive heat stabilizers. In addition, the compositions of this invention are resistant to ozone and are flexible and transparent.

The copolymers in accordance with this invention are acrylate-functionalized and, optionally, a heat stabilizer functionalized, both of which are nucleophically grafted randomly onto the polymer backbone. The compositions may efficiently be cured by either radiation or peroxide curing agents. The resulting cured polymer is essentially free of gel. Extractables are low (if at all present) by virtue of the relatively simple cure system.

The acrylate functionalized copolymer is derived from copolymers having a backbone comprising an isoolefin having from 4 to 7 carbon atoms and a para-alkylstyrene. The copolymer may be compounded with a wide variety of fillers including carbon black and calcined clay fillers.

The cured compositions of this invention may be molded into any of a wide variety of articles including those used in the biomedical industry, such as stoppers for medicament containers, vial closures, medical grade tubing and sheeting including enteral and parenteral feeding tubing, flexible containers including blood and medicament storage containers, catheters, seals for syringes, containers including water bottles and other instruments, and closure devices; heat resistant hoses, such as automotive radiator coolant hoses; wire cable insulation materials; condenser packing; and food contact articles.

DETAILED DESCRIPTION OF THE INVENTION

The present invention is drawn to curable polymer containing compositions which have particular applicability in industries where high purity materials are required or desired. When cured, the composition has a very low percentile amount, if any, of volatizable components. In fact, the compositions of the invention do not typically contain antioxidants, non-reactive stabilizers or curatives (other than peroxide curing agents) and thus are essentially free of extractables, such as sulfur-leaching materials. Further, they exhibit low permeability to air. The compositions of this invention further are free of those additives, such as ZnO, which absorb moisture from the air.

The curable compositions of this invention exhibit superior processability characteristics which are attributable to the low gel content. The level of "gel" in the shaped product is essentially zero percent. (As used herein, the term "gel" refers to the insoluble residue of rubber in the acrylate functionalized copolymer and is determined by exhaustive solvent extraction of soluble polymer in refluxing toluene for about 72 hours, then drying and weighing the remaining residue.) In addition, articles produced from the compositions of the invention are essentially free, or contain minute amounts, of extractable low molecular weight components, organic curatives, stabilizers, metals and halogenated compounds.

The Acrylate Functionalized Copolymer. The peroxide-or radiation- curable composition of this invention contains an acrylate functionalized copolymer. The copolymer comprises an isoolefin having from 4 to about 7 carbon atoms and a para-alkylstyrene and is further characterized as having acrylate and, optionally, heat stabilizer moieties nucleophically grafted randomly onto the para-alkylstyrene.

In a preferred embodiment, the isoolefin comprises isobutylene, and the para-alkylstyrene comprises functionalized para-methylstyrene.

The recurring para-alkylstyrenes of the copolymer for use in the invention include those of the structural formula:

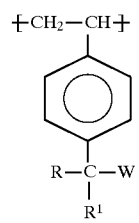

$$-\text{OC(O)CR}^2\!=\!\text{CR}^2\text{R}^3$$

in which R and $R^1$ are, independently, selected from the group consisting of hydrogen, alkyl, preferably $C_1$ to $C_5$ alkyl, and primary and secondary alkyl halides, preferably primary and secondary $C_1$ to $C_5$ alkyl halides; and W is a mix of (i) an acrylate group represented by the formula:

($R^2$ being hydrogen or alkyl of from 1 to about 20 carbon atoms, and $R^3$ being either $R^2$ or unsaturated alkyl from 1 to about 20 carbon atoms); (ii) a heat stabilizer and/or free radical scavenger group as herein defined; and (iii) hydrogen or a halogen selected from the group consisting of chlorine or bromine.

Preparation of the acrylate functionally modified copolymers used in this invention is set forth in U.S. Pat. No. 5,162,445, herein incorporated by reference, to which the instant application claims priority.

Preferably, the amount of acrylate moiety in the functionalized copolymer of this invention comprises from about 0.05 to about 5 mole percent, preferably from about 0.25 to about 1 percent, of the total mole percent of the copolymer.

The unsubstituted para-alkylstyrene (where W is hydrogen) may comprise from about 0.5 to about 90 mole percent of the copolymer, preferably from about 1 to about 10 mole percent and most preferably from about 2 to about 5 mole percent.

The halogenated para-alkylstyrene (wherein W is chlorine or bromine) may comprise up to about 10 mole percent of the copolymer, preferably less than about 5 mole percent, and more preferably less than about 1 mole percent of the copolymer. This moiety results from halogenation of the precursor polymer, discussed below.

The functionalized para-alkylstyrene, wherein W is the heat stabilizer or free radical scavenger, may be from 0 to about 5 mole percent of the functionalized copolymer, preferably between 0.05 to about 2 mole percent, more preferably between 0.05 to about 0.5 mole percent. In other words, the heat stabilizing substituent is present between about 1 ppm to about 3 percent by weight of the total weight of the functionalized copolymer, more preferably from about 0.1 to about 1 percent by weight, and typically at about 0.5 weight percent of the total weight of the curable composition.

The remainder of the copolymer generally comprises the isoolefin which usually ranges from about 10 to about 99.5 weight percent of the copolymer, preferably from about 80 to about 99 percent by weight, more preferably from about 90 to about 98 weight percent.

In a preferred embodiment, substantially complete conversion of the halogenated para-alkylstyrene is obtained, for example, by nucleophilic substitution thereof by the acrylate group and the heat stabilizer free radical scavenging groups, so that the radiation-reactive copolymer is essentially free of the halogenated para-alkylstyrene, preferably comprising less than about 1 percent by weight of the functionalized copolymer, more preferably less than about 0.5 percent, most preferably less than about 0.1 percent and especially less than about 0.02 mole percent.

The acrylate functionality is derived from an α,β-ethylentically unsaturated carboxylic acid represented by the formula:

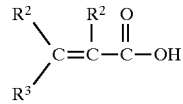

wherein each $R^2$ is independently hydrogen or alkyl of up to about 20 carbon atoms, preferably hydrogen, methyl or ethyl, and $R^3$ is hydrogen, alkyl or unsaturated alkyl of up to about 20 carbon atoms, preferably hydrogen or $C_1$–$C_4$ alkyl or alkenyl. The carboxylic acid preferably has from 3 to about 8 carbon atoms. Suitable representative examples of carboxylic acids from which the acrylate functionality is derived include acrylic acid, methacrylic acid, methyl methacrylic acid, ethacrylic acid, crotonic acid, isocrotonic acid, tiglic acid, angelic acid, senecioic acid, sorbic acid, and the like. Acrylic acid itself and methacrylic acid are preferred. For purposes of clarity and convenience, the functionality derived from the unsaturated carboxylic acids is collectively referred to as "acrylate" functionality, with the understanding that such reference is inclusive of such acrylic-type acids in addition to acrylic acid itself Preferred copolymers for use in the invention are represented by the formula:

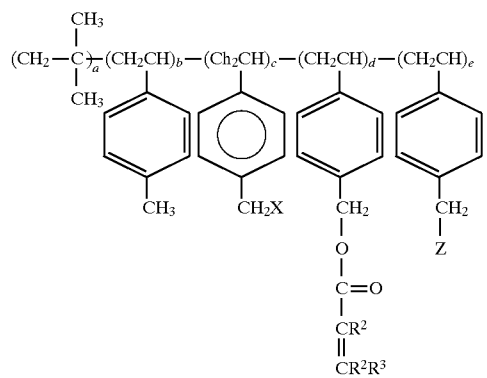

wherein the $R^2$ groups are independently selected from hydrogen or a $C_1$–$C_8$ alkyl group and $R^3$ is a hydrogen, a $C_1$–$C_8$ alkyl group or a $C_1$–$C_6$ alkylene group and further wherein a is about 1 to about 99%;

b is from 0 to about 90%;

c is from 0 to about 10%;

d is from about 0.05 to about 5%;

e is from 0 to about 5% and further wherein b+c+d+e is between about 1 to about 99%.

The heat stabilizer free radical scavenger moiety, represented by Z above, thermally stabilizes the acrylate-functionalized isobutylene/para-methylstyrene copolymer. The acrylate-functionalized copolymer may tend to gel or crosslink when subjected to elevated temperatures, but the thermally induced crosslinking or gel formation is substantially inhibited when the heat stabilizer free radical scavenger moiety is present in relatively minor proportions. In some circumstances, where the loading of the filler is sufficiently high, it is unnecessary to include the heat stabilizer free radical scavenger moiety in the copolymer.

The heat stabilizer free radical scavenger in the resultant copolymer serves as a heat stabilizer. Thus, the compositions of this invention do not require the addition of non-reactive thermal stabilizers, such as a hindered phenol like BHT or IRGANOX 1010. By grafting the heat stabilizer free radical scavenger directly onto the isobutylene/paraalklstyrene copolymer, the presence of low molecular weight compounds which might volatilize or leach out of the copolymer composition can be avoided.

The Z moiety can be incorporated into the acrylate-functionalized isobutylene/paraalkylstyrene/para-bromoalkylstyrene base terpolymer by means of nucleophilic substitution reactions between the benzylic halogen leaving group and the nucleophilic compound containing the Z moiety. Suitable compounds for the heat stabilizer free radical scavenger or Z moiety are those containing suitable reactive moieties for functionalization of the halogenated isoolefin/para-alkylstyrene base terpolymers via nucleophilic substitution, or those which can be readily modified to incorporate suitable reactive moieties such as hydroxy or carboxyl radicals or carboxylate salts or esters. They may consist of conventional photosensitizers. Representative compounds include:

(a) aromatic aldehydes and ketones such as benzophenone, 4-chlorobenzophenone, 4-hydroxybenzophenone, benzoquinone, naphthaquinone, anthraquinone, 2-chloroanthraquinone, benzylidene aceto-phenone, acetophenone, propiophenone, cyclopropyl phenyl ketone, benzaldehyde, β-napthylphenyl ketone, β-napthaldehyde, β-acetonaphthone, 2,3-pentanedione, benzil, fluorenone, benzanthrone, Michler's ketone, bis(parahydroxybenzylidene)acetone, benzoin, deoxybenzoin, chlorodeoxybenzoin and the like;

(b) alkoxy and acyl substituted aromatic compounds such as 2,2-dimethyloxy-2-phenyl, 1,3,5-triacetyl benzene, 2,5-diethoxy stilbene, and the like;

(c) hetero aromatic compounds such as thioxanthone and the like;

(d) fused ring polycyclic aromatic compounds such as anthracene, pyrene and the like;

(e) nitro aromatic compounds such as, for example, picramide, nitronaphthalene, 5-nitroacenaphthlene, 2-nitrofluorene and the like;

(f) dye compounds such as rose bengal, acridine orange, chlorophyllin, crystal violet, eosin Y, fluorescein, flavin mononucleotide, hematoporphyrin, hemin, malachite green, methylene blue, rhodamine B, chlorophyll, cosine, erthrosin, methylene green, toluidine blue, thionine, and the like;

(g) azide-containing compounds such as azidobenzene, p-phenylene bisazide,p-azidobenzophenone, 4,4-diazidobenzophenone, 4,4$^1$-diazidodiphenylmethane, 4,4$^1$-diazidostilbene, 4,4$^1$-diazidochalcone, 3,6di(4$^1$-azidobenzal)cyclohexanone, 2,6-di(4$^1$-azidobenzal)-4-methylcyclohexanone, and the like;

(h) diazonium salt radicals such as p-diazodiphenylamineparaformaldehyde condensates, 1-diazo-4-dimethylaminobenzene hydrofluoroborate, 1-diazo-3-methyl-4dimethylaniline sulfate and the like; and (i) multifunctional compounds containing the above photosensitive groups such as 1,2-naphthoquinonediazide, 2,3,4-trihydroxybenzophenone, bis-(naphthoquinone-1, 2-diazido-5-sulfonate), 2-(naphthoquinone-1,2-diazido-5-sulfonyloxy)-3-hydroxynaphthalene, naphthoquinone-1,2-diazido-5-sulfonic acid novolak ester, naphthoquinone-1,2-diazido-5sulfanilide, azidobenzoic acid, azidophthalic acid, and the like; and (j) metal chelate compounds such as benzene chromium tricarbonyl and the like.

Nucleophilic reagents capable of donating electrons to benzyl halides and displacing a halide ion via a substitution nucleophilic displacement reaction and attaching the acrylate functional group Y, and optionally the free radical scavenging reactive functional group Z, in the benzylic position from which the halogen is displaced may be Y or YM, or Z or ZM, wherein: M is hydrogen, a metal ion, or an ammonium ion and Y and/or Z are either a simple nucleophile containing oxygen, sulfur, silicon, carbon, nitrogen, phosphorus, or various metals; or Y and/or Z are a small molecule of molecular weight less than 1,000 which may contain other functionality in addition to the simple nucleophile which become attached at the benzylic position in the nucleophilic displacement reaction. Examples of such nucleophiles are set forth in U.S. Pat. No. 5,162,445.

Particularly preferred copolymers for use in this invention are those of the formula:

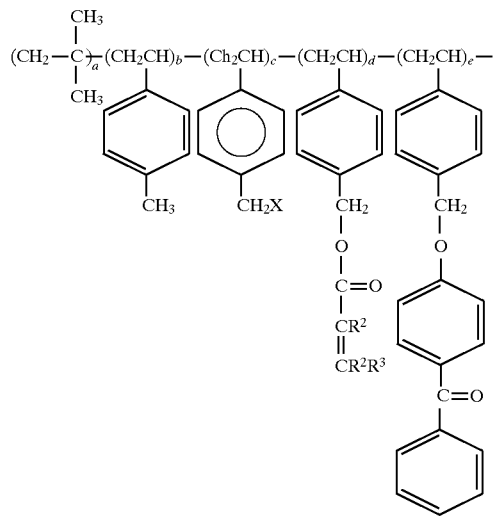

wherein a, b, c, d, e, $R^2$ and $R^3$ are as defined previously.

The functionalized, backbone saturated, copolymers for use in this invention may encompass a broad range in properties ranging from low Tg elastomers high in isobutylene to high Tg plastics high in paraalkylstyrene with tough high impact compositions at intermediate isobutylene contents.

The functionalized copolymers can be produced by first preparing a base terpolymer comprising a saturated hydrocarbon backbone with one or more pendant attached electrophilic moieties, and then attaching the functionalities via a selective nucleophilic substitution reaction with the pendant attached electrophilic moieties. It has been found to be desirable, and is important in obtaining the functionalized copolymer of this invention, that the pendant attached electrophilic moieties which are replaced by other functionalities via selective nucleophilic substitution reactions be benzylic halogen moieties. This base terpolymer containing electrophilic benzylic halogen moieties is the "parent" polymer from which the novel, pendant functionalized, backbone-saturated copolymers of this invention are prepared via selective nucleophilic substitution reactions.

The functionalized copolymers are comprised of the following "mer" units:

a) enchained isobutylene unit

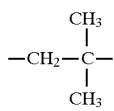

b) enchained p-alkyl-styrene unit

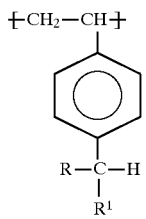

c) enchained brominated p-alkyl
-styrene unit (the electrophillic unit

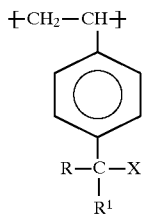

d) enchained pendant acrylate functional
group formed via nucleophillic substitution
benzylic halogen

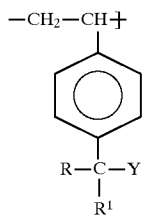

e) enchained pendant heat stabilizer free radical
scavenging functional group formed via nucleophillic
substitution of benzylic halogen

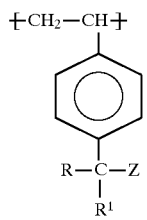

wherein: R and $R^1$ are independently selected from the group consisting of hydrogen, alkyl, and primary or secondary alkyl halide, X is a halogen atom (preferably bromine or chlorine, and most preferably bromine), Y represents an acrylate group attached to the polymer via nucleophilic substitution of one of the benzylic halogens so that an enchained c "mer" unit has become a d "mer" unit, and Z represents a heat stabilizer free radical scavenging group attached to the polymer via nucleophilic substitution of one of the benzylic halogens so that an enchained c "mer" unit has become an "e" mer unit.

Actually, there can be several, different Y and/or Z species in the same polymer in cases where mixed acrylate and/or heat stabilizer free radical scavenger functionalities are being introduced. Y and Z are the residues which become attached to the polymer enchained c "mer" unit in place of halogen when a nucleophilic reagent capable of donating electrons to benzyl halides is reacted with the base terpolymer in accordance with this invention.

The four (or more if several different Y and/or Z functionalities are present) "mer" units are attached to one another in random fashion to form the pendant acrylate functionalized, backbone saturated polymer in the composition of this invention.

The number average molecular weight of the functionalized polymer is from about 500 to about 500,000, more preferably from about 50,000 to about 300,000 and most preferably from about 50,000 to about 175,000.

By incorporating the acrylate and heat stabilizer free radical scavenging moieties directly onto the pendant paraalkylstyrene groups randomly dispersed in the polyisobutylene backbone, the polymer can be cured directly by electromagnetic radiation or by peroxide curing agents.

The precursor ("b mer") copolymer to the copolymers of the curable compositions of this invention are of homogeneous uniform compositional distribution. These copolymers, as evaluated by gel permeation chromatography (GPC), demonstrate narrow molecular weight distributions, or compositional uniformity over their entire range.

The precursor copolymer of isoolefin having between 4 and 7 carbon atoms and the para-alkylstyrene used for preparation of the functionalized copolymers is formed by admixing the isoolefin and the para-alkylstyrene in a copolymerization reactor under copolymerization conditions in the presence of a diluent, and a Lewis acid catalyst, and maintaining the copolymerization reactor substantially free of impurities which can complex with the catalyst or which can copolymerize with the isoolefin or the para-alkylstyrene. (Such precursor copolymers are now well known and methods for their preparation are well documented. See for instance, U.S. Pat. No. 5,162,445 being incorporated herein by reference.)

In this manner, precursor copolymers for making the above-described radiation functionalized copolymers are produced as direct reaction products, which, in their as-polymerized form, have a substantially homogenous compositional distribution, and which can also consist essentially of isoolefin and para-alkylstyrene.

U.S. Pat. No. 5,162,445 further discloses methods of producing the benzylic halogen functionalized copolymer. Halogenation may be carried out on the precursor paraalkylstyrene/isobutylene copolymers by any of the disclosed methods recited therein.

Substitution of acrylate-functional groups for the benzylic halogen which is a very reactive and versatile electrophile can be accomplished by nucleophilic substitution reactions to introduce the desired acrylate functionality, and optionally, one or more additional functionalities.

The benzylic halogen functionality can be made to undergo selective nucleophilic substitution reactions with a great range of nucleophiles, other than acrylates, so that almost any desired type and amount of functionality can be introduced without undesirable side reactions and under conditions which are mild enough to avoid degradation and/or crosslinking of the saturated copolymer backbone containing the pendant benzylic halogen functionality. Suitable nucleophiles include those containing oxygen, sulfur, nitrogen, phosphorus, carbon, silicon, and various metals including especially magnesium, lithium, sodium, and potassium. Suitable acrylate nucleophiles include, for example, carboxylate esters and salts such as tetraalkylammonium acrylates, and the like. Processing details for such nucleophilic substitution reactions are defined in U.S. Pat. No. 5,162,445.

By using isobutylene/paraalkylstyrene/para-bromoalkylstyrene terpolymers as a "base" polymer for modification, and by conducting nucleophilic substitution reactions under appropriate and controlled conditions, soluble, backbone-saturated copolymers containing useful pendant functionality have been prepared. Examples include:

(1) Esters; and
(2) Carboxylate esters and phenolates which contain peroxide—or radiation—reactive functional groups exemplified by benzoylbenzoate, cinnamate, tung oil fatty acid esters, and anthraquinone-2carboxylate.

A significant feature of the present invention is the elimination of the need of non-reactive additives, such as curatives and stabilizers when the acrylate functionalities and heat sensitive free radical scavengers are grafted to the para-alkylstyrene units of the isobutylene/paraalkylstyrene copolymer.

The composition may contain other ingredients which are non-migratory and which do not substantially adversely affect the system such as, for example, by adversely interfering with crosslinking.

Particulate fillers which may be used as fillers include fumed alumina, aluminum hydroxide, aluminum, aluminum silicates, bronze, lead, zinc, aluminum oxide, magnesium oxide, silicon dioxide, titanium dioxide, zinc oxide, asbestos, carbon black, clay, calcium silicate, magnesium silicate, feldspar, glass, mica, nepheline, perlite, pyrophyllite, talc, wollastonite, barium sulfate, calcium sulfate, lithopone, zinc sulfide, cellulose, fatty acids and esters, mineral rubber, calcium carbonate, barium carbonate, magnesium carbonate, calcium fluoride, and sodium aluminum fluoride. Of these, carbon black, clay and silica are especially preferred.

The selection, size and amount of filler is, of course, dependent on the utility of the shaped article. The relationship of reinforcing fillers to tear resistance, tensile strength and stiffness of an elastomer after vulcanization is well known in the art. Optimization of the amount, size and selection of filler for the desired property of the intended article will be readily appreciated.

For instance, where the shaped article is to be employed in the biomedical industry, silicon oxides, aluminum silicates, magnesium silicates, clays and titanium oxides may be desirably added to improve abrasion resistance, flexibility resistance or compression set. In particular, where the molded article is a stopper for use with medical containers, clay, carbon black and coloring pigments are especially desired. Where the desired shaped article is for use as condenser packing, carbon black and calcined clay are particularly preferred. Where the desired article is a hose, preferred fillers are calcium carbonate, clay, silica, talc and carbon black. Carbon black is further particularly desirable where the article is for use as a wire insulating or shielding material.

The filler is typically present in the cured composition from 0 to about 70 parts per 100 parts of rubber. Of course, the selection of the particular filler is dependent upon several factors—one of which is the vulcanization method.

Generally, the loading and selection of fillers must be closely monitored where the composition is to be cured by actinic radiation. In particular, where the composition is to be irradiated with shorter wavelengths, such as by uv light, it is best to use no filler. Otherwise, the source of vulcanization may be unable to fully penetrate the system.

Symmetric and asymmetric peroxides may be used as the vulcanizing agent in the present invention. Such peroxides include dicumyl peroxide, benzoyl peroxide, p-menthaneperoxide, 1,4-di-(t-butylperoxyisopropyl) benzene, 2,5-dimethyl-2,5-di-(t-butylperoxy)hexane, 2,5-dimethyl-2,5-di-(t-butylperoxy)hexyne-3, acetylacetoneperoxide, 3,3,5-trimethylhexanone peroxide, diisobutyrylperoxide and the like.

Where a peroxide curing agent is employed, vulcanization is usually conducted at a temperature ranging from about 130° C. to about 250° C., preferably from about 150° C. to about 200° C., for a time period ranging from about 1 to about 60 minutes. No degradation of the polymer backbone has been observed to occur with the peroxide curing agents.

Radiation curing, as used herein, refers to the full spectrum of electromagnetic radiation energies. These forms of radiation energy include ionizing radiation, e.g., alpha, beta and gamma rays from radioactive nuclei; x rays, high energy electrons; and nonionizing radiation such as are associated with uv, visible, ir, microwave and radio frequency wavelengths.

Suitable sources of actinic radiation employed to effect the crosslinking reaction include uv light sources, such as carbon arc, mercury-vapor arc and fluorescent sun lamps. Electron beam radiation or high energy ionizing radiation can be obtained from any suitable source such as an atomic pile, a resonant transformer accelerator, a Van de Graaf electron accelerator, a Linac electron accelerator, a betatron, a synchrotron, a cyclotron, or the like. Radiation from these sources will produce ionizing radiation such as electrons, protons, neutrons, deuterons, gamma rays, X-rays, α-particles and β-particles.

The amount and kind of irradiation required depends primarily on the type and amount of acrylate and/or radiation-sensitive functionality employed, thickness of the coating and the level of curing desired.

Suitable doses of electron beam radiation include, for example, from about 1 kGy (0.2 megarad) to about 200 kGy (40 megarad), preferably from about 1 kGy (1 megarad) to about 50 kGy (10 megarad). Suitable doses of UV radiation include from about 0.01 to about 2 $J/cm^2$, preferably from about 0.05 to about 0.50 $J/cm^2$/. The crosslinking reaction is conveniently effected at room temperature, but it can be conducted at depressed or elevated temperatures if desired. No degradation of the polymer backbone is known to occur where curing is conducted by radiation.

The dosage of radiation must be of high enough energy and intensity such that it penetrates to a sufficient depth into the curable composition to provide the requisite curing. Generally, actinic radiation and ultraviolet radiation are only permissible radiation sources with non-filled curable compositions. Filled compositions require radiation sources having greater wavelengths for effective penetration.

It is also desirable to effect the curing reaction within the confines of an inert atmosphere to prevent air inhibition of the crosslinking and to prevent oxidative degradation of the polymer.

The desired use of the shaped article will control the crosslink density of the cured composition. Crosslink density is a direct function of peroxide or radiation exposure and the type and concentration of acrylate and peroxide or radiation sensitive functionality. Important variables in determining the type of functionality include the desired degree of functionalization and wavelength of energy absorbance.

Shaped Articles. The invention further provides shaped articles of high purity containing essentially no extractables.

The shaped articles consist of the peroxide- or radiation-cured acrylate-functionalized copolymers described above.

Particularly preferred as the shaped articles within the invention are those useful in biomedical technology as well as condenser packings. In addition, the cured compositions are suitable in food contact applications, as well as wire cable insulation and shielding materials, hoses, power transmission belts and conveyor belting. The articles have a negligible percentile of extractables, excellent cure characteristics and are further heat, chemical, moisture and ozone resistant.

Biomedical Articles. The molded articles of this invention exhibit excellent moisture, chemical and heat resistance, low permeability to gases and vapors, good sealing properties and further generally exhibit a high degree of flexibility. As such, they have wide applicability in the manufacture of articles for use in the pharmaceutical, veterinary or health care industries. Such articles include those intended for contact with a body fluid or a medicament fluid such as medical grade tubing, rubber stoppers, vial closures, and storage vessels.

Included, but not limiting, of the articles in this area are enteral and parenteral feeding tubes, tubes for peristaltic pumps, catheters, dialysis tubes, bags for blood or plasma, intravenous bags, containers for blood transfusion systems, syringe seals, gaskets for syringes, rubber closures for vials of medicines, syringes, dropper bulbs, cap liners, vacuum sampling tubes or spits tube for inspecting the number and morphology of platelets in the blood and blood coagulating system, pharmaceutical container closures as well as pour-type dispensers or pour bottles. The latter are typically used in operating rooms or at emergency sites for wound irrigation.

Non-migratory colorants may also be added to the composition in order to provide marked or color-coded biomedical articles.

Where the shaped article is to be used as a blood bag, the article must exhibit high puncture resistance, low modulus, high tear resistance, low gas permeablability and autoclavability.

The biomedical articles referenced herein are well known in the art. See, for instance, U.S. Pat. No. 5,060,812 (rubber stoppers and plugs for medication containers), U.S. Pat. No. 4,839,429 (rubber closures for injectable products), U.S. Pat. No. 4,903,855 (closure and port assembly), European Patent Application 0 494 847 A1 (performable stoppers for test tubes), WO 93/23093 (medical port tubing), WO 93/14810 (blood bags and tubing), European Patent Application 0 596 811 A1 (blood bags and tubes), European Patent Application 0 566 755 A1 (catheters); and WO 94/08769 (tubing and sheeting), all of which are herein incorporated by reference.

The biomedical articles may easily be produced by customary manufacturing processes for thermoset materials which are well known in the art, such as molding, extrusion, injection molding, etc. Among extrusion methods, it is most suitable to adopt an inflation method or a T-die molding method.

For example, where the desired article is a blood or medicament bag, the composition may be charged into a twin-screw extruder where the components are mixed, and then extruded as a strand. The strand is then cut into pellets using a pelletizer. The material is then formed into sheets of desired thickness. The sheets are then optionally laminated with each other such that the layer in direct contact with the blood or medicament comprises the cross-linked copolymer of the invention.

Condenser Packings. In another aspect of the invention, an article consisting of the peroxide or radiation cured acrylate-functionalized copolymers described herein are molded in the form of rubber stoppers for use with electrolytic condensers. Such compositions may optionally contain reinforcing fillers. Such compositions, after being shaped and cured, demonstrate excellent resistance to moisture and heat.

Heat Resistant Hoses. In yet another embodiment, the invention provides a heat resistant hose consisting of the cured acrylate-functionalized copolymer set forth above. Such compositions may optionally contain a filler.

In particular, in light of their excellent heat resistivity, the cured compositions of the invention are especially useful as steam hoses, automotive radiator coolant hoses, automotive heater hoses, hydraulic hoses and high temperature conveyor belting as well as power transmission belts. Hoses within the invention may be able to withstand temperatures up to at least 200° C.

Preferred fillers for use as either a non-reinforcing filler or reinforcing filler include calcium carbonate, clay, silica, talc, carbon black and mixtures thereof.

Automotive radiator coolant hoses typically comprise an inner tube and an outer cover. Some hoses comprise reinforcements and/or other layers between the inner tube and the outer cover. The hose composition of the present invention may be used to produce the inner tube and/or the outer cover of the hose. In light of its absence of non-migratory additives, the invention is especially applicable for use in the manufacture of the inner tube.

Methods of manufacturing hoses are well known in the art. See for instance, U.S. Pat. No. 5,246,778, herein incorporated by reference. Such methods include forming the unvulcanized hose composition into an elongated tube and positioning it on a mandrel. A cover material is optionally applied to the outer surface of the tube and pressure is then applied, either directly or by wrapping the hose in a tape fabric, such as a plastic tape, and, thereafter, subjecting the hose to heat and steam pressure.

Alternatively, the hose may be manufactured by extrusion whereby the curable composition is first heated in an extruder which, in turn, forces the softened rubber mass through a pin and ring die configuration, thereby causing the composition to take the shape of a tube. The tube is cooled immediately in a water trough and is thereafter covered with an outer tube cover (which may also be derived from the curable composition of this invention) by passing the reinforced tube through a cross-head extruder. The resulting extruded, covered and reinforced tube is cooled again in a water trough, then cut into hose pieces of desired lengths which are placed on preformed mandrels. The hose pieces are then vulcanized by irradiation.

Foodstuff Contacting Materials. In addition, the composition of this invention can be used for other types of sanitary articles unrelated to the biomedical field. For instance, the invention may be used in the manufacture of food or beverage contact containers, sealants for water bottles or cans, as well as forming the rubber piece for cooking devices. When extruded into a film, such articles should exhibit low permeability to air.

Wire or Cable Insulation Materials. In yet another embodiment, the invention is drawn to a shaped article useful for the insulation of wire and cable lines containing the peroxide- or radiation-cured acrylate-functionalized copolymer. The composite is particularly useful when disposed over a braided shield of filter line wire or cable for enhancing its shielding range. The composite may be used in conjunction with a second composite insulation or shielding layer, either of the same or different composition.

The cured composition typically contains a filler, such as carbon black. The loading of filler is typically in the range of approximately between 10 wt. percent to about 35 wt. percent of the cured composition. When greater amounts of filler materials are employed, the tensile strength and elongation generally decreases.

The compositions of this invention may further be used for other miscellaneous molded and extruded mechanical rubber goods where high purity and excellent heat resistance and compression set are important.

Since articles within the invention are essentially free of extractable materials, they do not contain particles which may be shed. As demonstrated in the Examples which follow, the cured compositions of the invention exhibit superior tensile strength, compression set, heat resistance, chemical resistance and ozone resistance properties.

EXAMPLES

The following non-limiting examples, and comparative data, bring out the more salient features of the invention. All parts are given in terms of weight units except as otherwise indicated.

Coatings were prepared by dissolving the polymer compositions in toluene and knife coating onto MYLAR or release paper. The coating thicknesses were then dried and irradiated. The coatings thicknesses were typically 2.0 mil.

EB crosslinking was performed on an Energy Sciences CB-150 Electrocurtain Electron Beam Accelerator.

Example 1

Preparation of Acrylate and Methacrylate Functionalized Copolymers of Isobutylene Parabromomethylstyrene Copolymer The isobutylene/para-methylstyrene/parabromomethylstyrene base terpolymer was prepared as according to U.S. Patent No. 5,162,445.

Terpolymer derivatives having either acrylate or methacrylate units and benzophenone moieties substituted on the isobutylene/para-methylstyrene/para-bromomethylstyrene were then prepared. A 5000 ml glass-jacketed reaction vessel fitted with an overhead stirrer, a hose connector and septum was purged with nitrogen. At room temperature under nitrogen, the vessel was charged with toluene (2500 ml) and 450 g of the base isobutylene|paramethylstyrene/para-bromomethylstyrene terpolymer above comprising 2.4 total mole percent para-methylstyrene, including 1.10 mole percent para-bromomethylstyrene, and having a Mooney viscosity of 32 (1+8 min., 125° C.). The base terpolymer was dissolved by stirring at room temperature overnight. A tetrabutylammonium salt of acrylic acid (or methacrylic acid) was prepared in a second flask by charging 101.3 ml tetrabutylammonium hydroxide (1.0M in methanol) and 7.3 ml acrylic acid (7.0 ml methacrylic acid) and 4 g of 4-hydroxybenzophenone and 30 ml of methanol to the flask and stirring at room temperature to give a water-white clear solution. This solution was then added to the flask containing the dissolved base terpolymer, at a circulating bath temperature of 83° C. After 45 minutes, the bath temperature was raised to 95° C. and let to run for 7.5 h. Then the bath temperature was lowered to 70° C., and after a 2.5 h period, the reaction was let to cool. The yellowish viscous solution was quenched and washed with 10 ml HCl in 1000 ml deionized water, and subsequently washed with $H_2O$/IPA (70:30) 5 to 6 times. The polymer was isolated by precipitation into 0.1% BHT in isopropanol (IPA) and dried in vacuo for 48 h at 1 mm Hg and 80° C.

The resulting (uncured) copolymer was characterized as set forth in Table I. Polymer A and Polymer B reference the acrylic and methacrylic acid derivatives, respectively.

TABLE I

| Sample | Mooney Viscosity[1] mL, 1 + 8, 125° C. | PMS (mol. %) | Acrylic (mol. %) | Methacrylic (mol. %) | Benzophenone (mol. %) |
|---|---|---|---|---|---|
| Polymer A | 32 | 2.55 | 0.35 | — | 0.13 |
| Polymer B | 32 | 2.62 | — | 0.41 | 0.11 |

[1]ASTM D-1646, radial cavity die.

Example 2

A composition was prepared by separately mixing on a FERREL® Model 6VG350 6 inch (15.24 cm) OD two-roll mill at room temperature the acrylic acid and methacrylic acid derivatives of isobutylene/para-methylstyrene/parabromoethylstyrene base terpolymer—Polymer A and Polymer B, respectively. To each was added carbon black (50 parts of carbon black per hundred parts of rubber (phr)). Mixing was allowed to continue for five minutes.

Example 3

The compositions of Example 2 were pressed into sheets of approximately 20 mil. in thickness. Both sides of the pads were then exposed to a predetermined dosage of radiation by an electron beam curtain at room temperature.

The tensile strength measurement was based on ASTMD 412-92. Irradiated samples exhibited excellent tensile properties compared to non-irradiated samples. The properties for the compositions containing Polymer A are set forth in Table II:

TABLE II

| E.B. Dose, M Rad | Thickness mils | 100% Mod. psi | 200% Mod. psi | 300% Mod. psi | 400% Mod. psi | 500% Mod. psi | Tensile Strength psi | Elongation % |
|---|---|---|---|---|---|---|---|---|
| 0 | ~20 | 105 | 110 | 106 | 99 | — | 92– | 2100+ |
| 2.5 | 18.5 | 182 | 416 | 683 | 852 | 1003 | 1026 | 505 |
| 5.0 | 20 | 208 | 491 | 775 | 939 | — | 1103 | 490 |
| 10.0 | 18.7 | 284 | 691 | 1018 | — | — | 1172 | 375 |
| 20.0 | 19.5 | 297 | 764 | — | — | — | 1017 | 275 |

The properties for the methacrylic acid derivative containing compositions are set forth in Table III.

TABLE III

| E.B. Dose, M Rad | Thickness mils | 100% Mod. psi | 200% Mod. psi | 300% Mod. psi | 400% Mod. psi | 500% Mod. psi | Tensile Strength psi | Elongation % |
|---|---|---|---|---|---|---|---|---|
| 0 | ~20 | 99 | 96 | 76 | 64 | 52 | 6– | 2100+ |
| 2.5 | 19.4 | 655 | 1209 | — | — | — | 1209 | 200 |
| 5.0 | 20.1 | 722 | 1219 | — | — | — | 1234 | 205 |
| 10.0 | 19.4 | 635 | 1305 | — | — | — | 1397 | 215 |
| 20.0 | 19.7 | 574 | 1140 | — | — | — | 1197 | 215 |

The vulcanizates were of high purity and characterized as having essentially no extractable volatile low molecular weight molecules such as organic curatives, stabilizers, metals, halogenated compounds, etc. They are particularly suitable and desirable for use in applications which require high purity compounds, such as electronic (condenser packing), electrical (wire cable insulation) and biomedical applications.

Example 4

Compositions were prepared by blending the methacrylate and acrylate modified copolymers of Example 1 with 90 phr of Whitex clay and 3.0 phr low mw polyethylene on a FERREL® Model 6VF350 6 inch (15.24 cm) OD two-roll mill at room temperature for 15 minutes. The polyethylene serves as a processing aid to assist in the mixing of the modified copolymer. To the resulting blend was added a specified amount of dicumyl peroxide (100% active) at room temperature for 5 minutes. The amount of dicumyl peroxide (100% active) and the cure characteristics of the resulting composition are set forth in Table IV:

TABLE IV

| | Wt. % Dicumyl Peroxide | | | | | | | | | | |
|---|---|---|---|---|---|---|---|---|---|---|---|
| | Methacrylate modified, Polymer B | | | | | | Acrylate modified, Polymer A | | | | |
| | 2 | 1 | 0.5 | .25 | 0.15 | 0.125 | 2 | 1 | 0.5 | .25 | 0.1 |
| | Cure Characteristics[2] | | | | | | | | | | |
| MH- lb-in. | 81.3 | 80.7 | 67.1 | 57.4 | 49.2 | 57.4 | 77.2 | 79.2 | 79.4 | 77.7 | 62.5 |
| ML, lb-in. | 8.4 | 9.0 | 7.0 | 5.8 | 7.3 | 5.8 | 10.8 | 10.8 | 9.4 | 8.4 | 7.3 |
| MH-ML | 72.9 | 71.7 | 60.1 | 51.6 | 41.9 | 51.6 | 66.4 | 68.4 | 70.0 | 69.3 | 55.2 |
| ts2, min. | 1.2 | 1.5 | 2.1 | 2.7 | 3.2 | 2.7 | 2.0 | 1.9 | 1.9 | 2.8 | 4.8 |
| t'90, min. | 3.6 | 5.3 | 7.8 | 10.8 | 12.8 | 10.8 | 3.1 | 3.6 | 4.8 | 8.0 | 19.6 |

[2]Cure Meter Testing based on ASTM D-2084, (170° C., 30 min., 3° arc (no preheat), 1.67 Hz.

Table IV illustrates that a lower cure state of the composition is observed when the concentration of peroxide curing agent is low.

Example 6

Composition A and Composition B, were prepared by mixing the acrylate and methacrylate functionalized copolymers, Polymer A and Polymer B, respectively, of Example 1 with 50 phr carbon black and 2 phr dicumyl peroxide (40% active) in a midget (300 g) Banbury mixer at room temperature for 10 minutes.

The cure characteristics of the resulting composition are set forth in Tables V and VI:

TABLE V

| Sample | Mh | Ml | Mh–Ml | Ts2 | T90 |
|---|---|---|---|---|---|
| 60 Minutes @ 170° C. | | | | | |
| Comp. A | 50.1 | 11.6 | 38.5 | 1.8 | 5.1 |
| Comp. B | 53.4 | 10.4 | 43.0 | 2.0 | 7.6 |
| 30 Minutes @ 160° C. | | | | | |
| Comp. A | 50.3 | 11.8 | 38.5 | 3.3 | 11.5 |
| Comp. B | 53.0 | 11.6 | 41.4 | 3.6 | 15.3 |

| Mooney Scorch* Sample | 2 Point Rise (Minutes) | 5 Point Rise (Minutes) |
|---|---|---|
| Comp. A | 28.55 | 29.33 |
| Comp. B | 29.95 | 31.20 |

*1 minute preheat included, 125° C.

TABLE VI[1]

| | % Compression Set[2] | Hardness[3] | Tear Strength[4], KN/m | 100%, MPa | 200%, MPa | Tensil Strength[5], MPa | % Elongation |
|---|---|---|---|---|---|---|---|
| Comp. A | 21.9 | 54.2 | 25.69 | 2.269 MPa | 6.874 MPa | 10.495 MPa | 292 |
| Comp. B | 19.6 | 53.2 | 31.46 | 2.163 MPa | 7.273 MPa | 10.933 MPa | 272 |

[1]Pads pressed out for 15 min. @ 150° C.
[2]117 hrs., 150° C.
[3]ASTM D2240-91
[4]ASTM D624-91
[5]ASTM D412-92

The stability of the compositions is illustrated in Table VI. The tensile strength of the compositions were measured after 7 and 14 days. Stability was also demonstrated by the static ozone test. In the latter test, two samples each of Composition A and Composition B were exposed at 40% elongation at 40° C. to 100 pphm (100 parts per hundred million) ozone in air in a chamber. After 696 hours of exposure, no cracks were observed. Even under a 50× microscope, no cracks were seen. Further, the hardness of the compositions were relatively unchanged after 14 days.

TABLE VI

| | | 7 Days @ 150° C. | | |
|---|---|---|---|---|
| Tensile Test | 100%, MPa | 200%, MPa | TS, MPa | % Elongation |
| Comp. A | 2.642 | 7.692 | 10.475 | 256 |
| Comp. B | 2.280 | 7.215 | 10.427 | 262 |
| | | 14 Days @ 150° C. | | |
| Comp. A | 2.337 | 6.788 | 9.402 | 257 |
| Comp. B | 1.770 | 5.672 | 7.992 | 252 |

| | | 7 Days @ 180° C. | | | |
|---|---|---|---|---|---|
| 100%, MPa | 200%, MPa | TS, MPa | % Elong. | Tensil Strength, MPa (Δ%) | % Elongation (Δ%) |
| 2.795 | 8.174 | 11.362 | 264 | 4 | −10 |
| 2.282 | 7.590 | 11.321 | 267 | 4 | 0 |

| | | 14 Days @ 180° C. | | | |
|---|---|---|---|---|---|
| 1.355 | 3.606 | 4.420 | 236 | | |
| 1.099 | 3.328 | 5.527 | 285 | | |

| | Static Ozone | 5 Hours | 24 Hours | 168 Hours | 336 Hours | 524 Hours | 672 Hours |
|---|---|---|---|---|---|---|---|
| Comp. A | | PASS | PASS | PASS | PASS | PASS | PASS |
| Comp. B | | PASS | PASS | PASS | PASS | PASS | PASS |

| Hardness Test | 14 Days @ 150° C. | | 14 Days @ 180° C. | |
|---|---|---|---|---|
| | Initial | 5 Second | Initial | 5 Second |
| Comp. A | 58.7 | 50.5 | 57.7 | 49.4 |
| Comp. B | 57.6 | 49.8 | 56.9 | 50.2 |

Example 7

Five different curable compositions were prepared by mixing the acrylate and methacrylate functionalized copolymers, Polymers A and B, respectively (of Example 1), with 50 phr carbon black and dicumyl peroxide (40% active) in a micromill at room temperature for 20 minutes. Table VIII compares the cure characteristics of the resulting compositions. Comp. A and Comp. B reference the compositions of Example 6 above.

TABLE VIII

| Rheometers Sample | Wt. %, Peroxide | MH, dN · m | ML, dN · m | MH-ML | Ts2 (min) | T'90 (min) |
|---|---|---|---|---|---|---|
| Comp. A, Ex. 6 | 2.0 | 50.1 | 11.6 | 38.5 | 1.8 | 5.1 |
| Comp. B, Ex 6 | 2.0 | 53.4 | 10.4 | 43.0 | 2.0 | 7.6 |
| Polymer A | 2.5 | 48.0(R) | 8.5 | 39.5 | 1.9 | 4.7 |
| Polymer B | 2.5 | 52.0(R) | 9.0 | 43.0 | 2.1 | 6.7 |
| Poly A | 0.5 | 39.2 | 9.5 | 29.7 | 3.1 | 12.2 |
| Poly B | 0.5 | 31.8 | 6.7 | 25.1 | 3.7 | 13.2 |
| Polymer B | 0.0 | 11.2 | 9.9 | 1.3 | | 50.5 |

Example 8

A series of compositions were prepared comparing the closure compositions of the present invention with those of the prior art. In the examples, compounds A and F were prepared using resin cured butyl and peroxide cured butyl rubbers, respectively, that are commercially available. Composition A containing "Butyl A", a commercially available resin from Exxon Chemical Company designated 268. Composition A had a cure time of approximately 47 minutes. Composition F contained a polymer, XL 10000, commercially available from Polysar Corporation (Bayer A. G.). Composition F was cured with dicumyl peroxide at a temperature of 110° C. for 5.8 minutes.

Compositions B–E were cured with dicumyl peroxide at a temperature of 170° C. and a cure time in the range of 4 to 4.75 minutes. Compositions B and C were prepared using isobutylene paramethylstyrene copolymer containing 0.25 mole % methacrylic ester pendant to the para-methylstyrene group (methacrylate Polymer A). Compositions D and E were similar to those in B and C except that they contain 0.35 methacrylic ester functional groups (methacrylate Polymer B). Polymers A and B were those of Example 1 above.

Compositions A–F were prepared by admixing the designated components in a midget Banbury mixer at 80° C. for 9 minutes.

Compositions A–F (see Table IX) were processed in a manner similar to Example 4. The compositions were all cured for 20 minutes at 160° C. in a steam heated compression mold. The cured characteristics of the compositions are set forth in Table X.

TABLE IX

| Composition | A phr | B phr | C phr | D phr | E phr | F phr |
|---|---|---|---|---|---|---|
| Butyl A | 100 | 0 | 0 | 0 | 0 | 0 |
| Methacrylate Polymer A | 0 | 100 | 100 | 0 | 0 | 0 |

TABLE IX-continued

| Composition | A phr | B phr | C phr | D phr | E phr | F phr |
|---|---|---|---|---|---|---|
| Methacrylate Polymer B | 0 | 0 | 0 | 100 | 100 | 0 |
| XL 10000 | 0 | 0 | 0 | 0 | 0 | 100 |
| Carbon Black[1] | 35 | 35 | 35 | 35 | 35 | 35 |
| Carbon Black[2] | 20 | 20 | 20 | 20 | 20 | 20 |
| Calcined Clay[3] | 100 | 100 | 100 | 100 | 100 | 100 |
| Zinc Oxide | 3 | 0 | 0 | 0 | 0 | 0 |
| St. A[4] | 1 | 0 | 0 | 0 | 0 | 0 |
| Tackirol 201[5] | 10 | 0 | 0 | 0 | 0 | 0 |
| Dicup 40C | 0 | 3 | 3 | 3 | 3 | 3 |
| HVA-2[6] | 0 | 2 | 0 | 2 | 0 | 1 |
| TMC[7] | 0 | 0 | 2 | 0 | 2 | 0 |

[1] N754 Black (SRF-LS)
[2] MI Black
[3] Satintone SP-33, a product of Englehard Minerals Corp.
[4] St. A is Stearic Acid.
[5] an alkylphenol-formaldehyde resin, a product of Sumitomo Chemical Co., Ltd.
[6] N,N$^1$-m-phenylenediamaleimide, a product of E.I. du Pont de Nemours and Co.
[7] triallyl isocyanurate, a product of Nippon Kasei Chemical Co., Ltd.

TABLE X

| Composition | 1 | 2 | 3 | 4 | 5 | 6 |
|---|---|---|---|---|---|---|
| Mooney Vis., 1 + 4, 100° C. (JIS K 6300) | 87.7 | 89.2 | 93.3 | 107.0 | 98.8 | 104.7 |
| Mooney Scorch 5 pt. min. 125° C., ML or MS 35 pt. min. (JIS K 6300) | 37.4 80.9 | 24.4 27.1 | 20.2 22.4 | 30.3 33.1 | 26.0 28.8 | 7.2 8.1 |
| Minimum Reading Rheometer, Arc. +/− 3° (ASTM D2064) 170° C. | 36.1 | 30.9 | 34.9 | 42.0 | 39.6 | 45.5 |
| ML, lb, inch | 8.8 | 7.6 | 9.3 | 11.3 | 11.1 | 16.1 |
| MH, lb, inch | 35.2 | 73.8 | 57.0 | 96.5 | 86.7 | 75.6 |
| Ts2, m.s | 4.43 | 1.20 | 1.11 | 1.20 | 1.19 | 0.54 |
| Tc90, m.s | 47.41 | 4.32 | 3.59 | 4.46 | 4.03 | 5.49 |
| Original Cured 170° C. (JIS K6301) | | | | | | |
| Cure Time, Min. | 50 | 5 | 5 | 5 | 5 | 5 |
| Hardness, Shore A | 67 | 78 | 71 | 79 | 76 | 72 |
| 100% Modulus, Kg/cm$^2$ | 18 | 62 | 37 | 71 | 55 | 53 |
| 300% Modulus, Kg/cm$^2$ | 39 | — | — | — | — | — |
| Tensile Strength, Kg/cm$^2$ | 65 | 69 | 51 | 74 | 62 | 60 |
| % Elongation | 710 | 150 | 295 | 130 | 170 | 150 |
| Tear Strength, Kg/cm | 30 | 18 | 22 | 15 | 15 | 13 |
| Aged 125° C. 96 Hrs. (JIS K6301) | | | | | | |
| Cure Time, Min. | | | | | | |
| Hardness, Shore A | 72 | 80 | 78 | 82 | 81 | 75 |
| 100% Modulus, Kg/cm$^2$ | 27 | 85 | 61 | 98 | 88 | 75 |
| 300% Modulus, Kg/cm$^2$ | 47 | — | — | — | — | — |
| Tensile Strength, Kg/cm$^2$ | 48 | 93 | 82 | 102 | 98 | 77 |
| % Elongation | 340 | 120 | 180 | 110 | 130 | 105 |

TABLE X-continued

| Composition | 1 | 2 | 3 | 4 | 5 | 6 |
|---|---|---|---|---|---|---|
| Aged 150° C. 96 Hrs. (JIS K6301) | | | | | | |
| Cure Time, Min. | | | | | | |
| Hardness, Shore A | 48 | 85 | 78 | 80 | 82 | 74 |
| 100% Modulus, Kg/cm$^2$ | 16 | 76 | 58 | 101 | 93 | 70 |
| 300% Modulus, Kg/cm$^2$ | — | — | — | — | — | — |
| Tensile Strength, Kg/cm$^2$ | 23 | 81 | 77 | 101 | 100 | 70 |
| % Elongation | 280 | 130 | 170 | 100 | 110 | 100 |
| Tear strength, Kg/cm | 17 | 18 | 21 | 15 | 16 | 11 |
| Comp. set, 125° C., 70 hrs. (JIS K6723) | 51.8 | 28.3 | 29.0 | 14.5 | 15.4 | 29.5 |
| Volume Resistivity (JIS K6301) | | | | | | |
| 500 V. 2 min., Ohm-cm | 0.68 | — | — | 0.135 | 0.119 | 0.264 |
| Power 10 | 15 | | | 14 | 15 | 16 |
| Volume Swell, 110° C. × 24 hrs. | | | | | | |
| Volume Charge %-γ-Butyrolactone (JIS K6301) | 0.61 | — | — | 1.38 | 1.02 | 1.30 |

As seen from the data reported in Table X, cure time for the derivatives was approximately 5 min. at 170° C. The resin cured butyl rubber had a cure time of over 47 min. and the peroxide cured cross-linked butyl rubber had a cure time of 5.8 min. As can further be seen from the data in that table for the compositions of the invention, particularly those containing 0.35 mole % methacrylate derivative, the tensile strength was considerably higher than the control compounds averaging 10 MPa vs. 4.8 and 7.7 for the prior art compositions. Moreover, the compositions of the present invention retain their initial tensile strength while those of the prior art decrease significantly after heat aging at 150° C.

The tensile strength of Compositions B–E is considerably higher than Composition A or F; and average of 10 MPa for Compositions D and E versus 4.8 and 7.7 MPa for Compositions A and F, respectively. After heat aging at 150° C., compositions D and E retained their original tensile strength of 10 MPa, while Compositions A and F decreased to 2.3 and 7.0, respectively.

The compression set of Compositions C and D was around 15%, much less than that of Composition A (52%) and Composition F (39%). Since they contain essentially no halogen, Compositions B–E have high purity and are suitable for use in all the designated applications described herein. In particular, since they exhibit excellent electrical properties, fast curing rates, excellent heat resistance and compression set and good processability, these materials are uniquely suited to condenser packing applications.

What is claimed is:

1. A peroxide or radiation curable composition comprising:
   (i) a copolymer of an isoolefin of 4 to 7 carbon atoms and para-alkylstyrene comonomer;
   acrylate functionality nucleophilically grafted randomly onto a portion of the para-alkyl groups of the copolymer; heat stabilizing free radical scavenger functionality nucleophically grafted randomly onto a second portion of the para-alkyl groups of the copolymer; and
   (ii) a filler.

2. The cured composition of claim 1 wherein the composition is either peroxide curable or radiation curable.

3. The composition of claim 1 wherein the filler is selected from the group consisting of fumed alumina, aluminum hydroxide, aluminum, bronze, lead, zinc, aluminum oxide, magnesium oxide, silicon dioxide, titanium dioxide, zinc oxide, asbestos, clay, calcium silicate, feldspar, glass, mica, nepheline, perlite, pyrophyllite, talc, wollastonite, barium sulfate, calcium sulfate, lithopone, zinc sulfide, cellulose, fatty acids and esters, mineral rubber, calcium carbonate, barium carbonate, magnesium carbonate, calcium fluoride, sodium aluminum fluoride, and carbon black.

4. A cured composition comprising:
   (i) a copolymer of an isoolefin of 4 to 7 carbon atoms and para-alkylstyrene comonomer;
   acrylate functionality nucleophilically grafted randomly onto a portion of the para-alkyl groups of the copolymer; heat stabilizing free radical scavenger functionality nucleophically grafted randomly onto a second portion of the para-alkyl groups of the copolymer; and
   (ii) a filler.

5. The cured composition of claim 4 wherein the filler is selected from the group consisting of fumed alumina, aluminum hydroxide, aluminum, bronze, lead, zinc, aluminum oxide, magnesium oxide, silicon dioxide, titanium dioxide, zinc oxide, asbestos, clay, calcium silicate, feldspar, glass, mica, nepheline, perlite, pyrophyllite, talc, wollastonite, barium sulfate, calcium sulfate, lithopone, zinc sulfide, cellulose, fatty acids and esters, mineral rubber, calcium carbonate, barium carbonate, magnesium carbonate, calcium fluoride, sodium aluminum fluoride, and carbon black.

* * * * *